United States Patent
Ishiwata et al.

(10) Patent No.: US 6,792,013 B2
(45) Date of Patent: Sep. 14, 2004

(54) AUTO POWER CONTROL CIRCUIT FOR LASER DIODE

(75) Inventors: Hiromasa Ishiwata, Tokyo (JP); Akihiro Saito, Yamagata (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/988,322

(22) Filed: Nov. 19, 2001

(65) Prior Publication Data

US 2002/0061040 A1 May 23, 2002

(30) Foreign Application Priority Data

Nov. 22, 2000 (JP) .................................... 2000-356202

(51) Int. Cl.⁷ .............................................. H01S 3/00
(52) U.S. Cl. ...................................... 372/33; 372/38.1
(58) Field of Search ............................. 372/33, 38.01; 219/121.2; 369/116; 327/109; 359/187; 572/53–54, 38

(56) References Cited

U.S. PATENT DOCUMENTS

| | | | | |
|---|---|---|---|---|
| 4,884,280 A | * | 11/1989 | Kinoshita ................ | 372/29.02 |
| 4,950,268 A | * | 8/1990 | Rink ......................... | 606/12 |
| 5,197,059 A | * | 3/1993 | Minami et al. ............. | 369/116 |
| 5,446,716 A | * | 8/1995 | Eastman et al. ............ | 369/116 |
| 5,513,197 A | * | 4/1996 | Koishi ........................ | 369/116 |
| 5,767,704 A | * | 6/1998 | Larson ....................... | 327/109 |
| 5,831,951 A | * | 11/1998 | Kamioka et al. ......... | 369/47.26 |
| 5,946,332 A | * | 8/1999 | Terao .......................... | 372/33 |
| 5,978,124 A | * | 11/1999 | Maekawa et al. .......... | 359/187 |
| 6,137,816 A | * | 10/2000 | Kinbara .................. | 372/29.012 |

* cited by examiner

Primary Examiner—Don Wong
Assistant Examiner—Hung Tran Vy
(74) Attorney, Agent, or Firm—McGinn & Gibb, PLLC

(57) ABSTRACT

An auto laser power control circuit is provided which improves the response of the optical output level of a laser diode in accordance with variations in the operation mode.

In an auto laser power control circuit for comparing a voltage corresponding to the optical output from the laser diode which emits a light in accordance with a supplied driving current with a reference voltage, and controlling the driving current so as to reduce the difference at the time of the steady operation, by controlling a switch connected between the input and output terminals of an operational unit which compares the voltage corresponding to the optical output from the laser diode and the reference voltage, the driving current to the laser diode is controlled with a smaller time constant upon the start such as a transition of from a read operation mode to a write operation mode as compared with the time of the steady operation.

21 Claims, 9 Drawing Sheets

AUTO POWER CONTROL CIRCUIT FOR LASER DIODE

BACKGROUND OF THE INVENTION

1. Field of the Invention

The present invention relates to electronic equipment such as an optical disk device or a rewritable CD-ROM device, which performs writing and reading operation by using a laser diode as a light source. More particularly, it relates to an auto power control circuit for a laser diode or an auto laser power control (ALPC) circuit which is used to control a power to be supplied to the laser diode to keep the optical output from the laser diode constant.

2. Description of the Related Art

Figure 6:
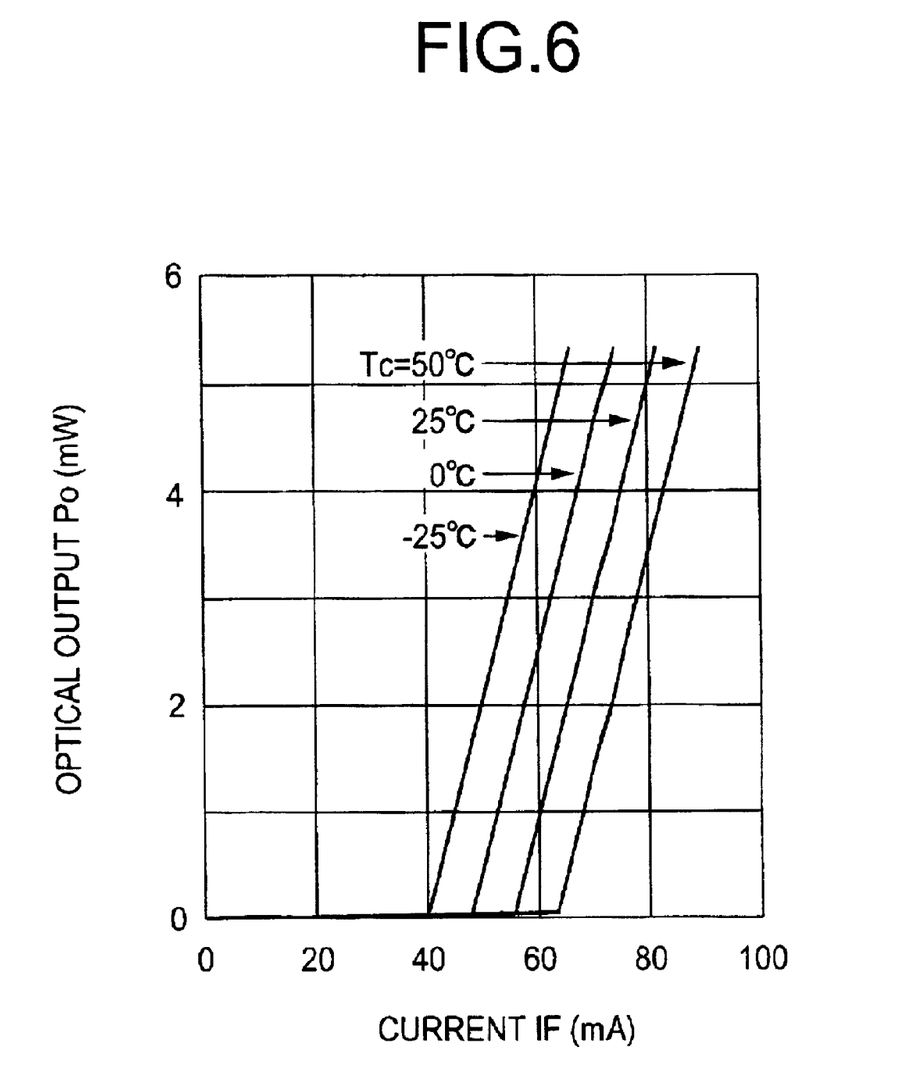
FIG. 6 is a graph representative of the characteristic in an optical output power to a driving current of a laser diode.

An optical disk device or a rewritable CD-ROM device uses a laser diode as a light source, and performs data writing and reading operation by irradiation of a laser light onto a disk. However, the optical output from the laser diode varies widely according to ambient the temperature, the operating period of time and so on. As is understood from FIG. 6, for example, even if the laser diode is driven by a certain current IF, the optical output power Po significantly varies according to the temperatures Tc of 50° C., 25° C., 0° C. and −25° C. It may thus occur that the oscillating operation of the laser diode stops or the optical output from the laser diode becomes too large with result of destruction. It is therefore required to control the driving current to be supplied to the laser diode in order to obtaing a substantially constant optical output power.

To this end, the ALPC circuit is provided to detect the optical output from the laser diode and to then control the driving current flowing through the laser diode such that the optical output from the laser diode is kept constant.

The description will be made on the fundamental ALPC circuit with reference to FIG. 7. This ALPC circuit 100 has a laser diode (LD) 1, a photodiode (PD) 2, a current-to-voltage converter or an I/V converter 3, an operational amplifier 4 and a current booster 5. The photodiode 2 is used to detect the optical output 101 from the LD1 and thus generates a detected current Is that is representative of the power of the optical output 101. This current Is flows through a resistor RM in the I/V converter 3 so that an optical detection voltage Vd corresponding to the optical output detection current Is is generated across the resistor RM. This voltage Vd is supplied to an inverting input terminal (−) of the operational amplifier 4 having a non-inverting input terminal (+) supplied with a reference voltage Vref. The current booster 5 is constituted by a PNP transistor Q and an resistor RL connected between the emitter thereof and a power voltage line Vcc. The base of the transistor Q is connected to the output of the operational amplifier 4, and the collector thereof is connected to LD1 to supply a driving current IF thereto.

In this manner, the driving current IF of the LD1 is controlled such that the optical detection voltage Vd becomes equal to the reference voltage Vref. The optical output from the LD1 is thus controlled to be constant. For example, when the optical output 101 from the LD1 increases due to the temperature variations, the optical detection current Is from the photodiode PD2 increases accordingly. The increase in the optical detection current Is makes larger the voltage drop across the resistor RM to lower the optical detection voltage Vd. In response thereto, the operational amplifier 4 increases the base potential of the transistor Q, so that the driving current IF is made small. The optical output power 101 of the LD1 is thus decreased.

Figure 7:
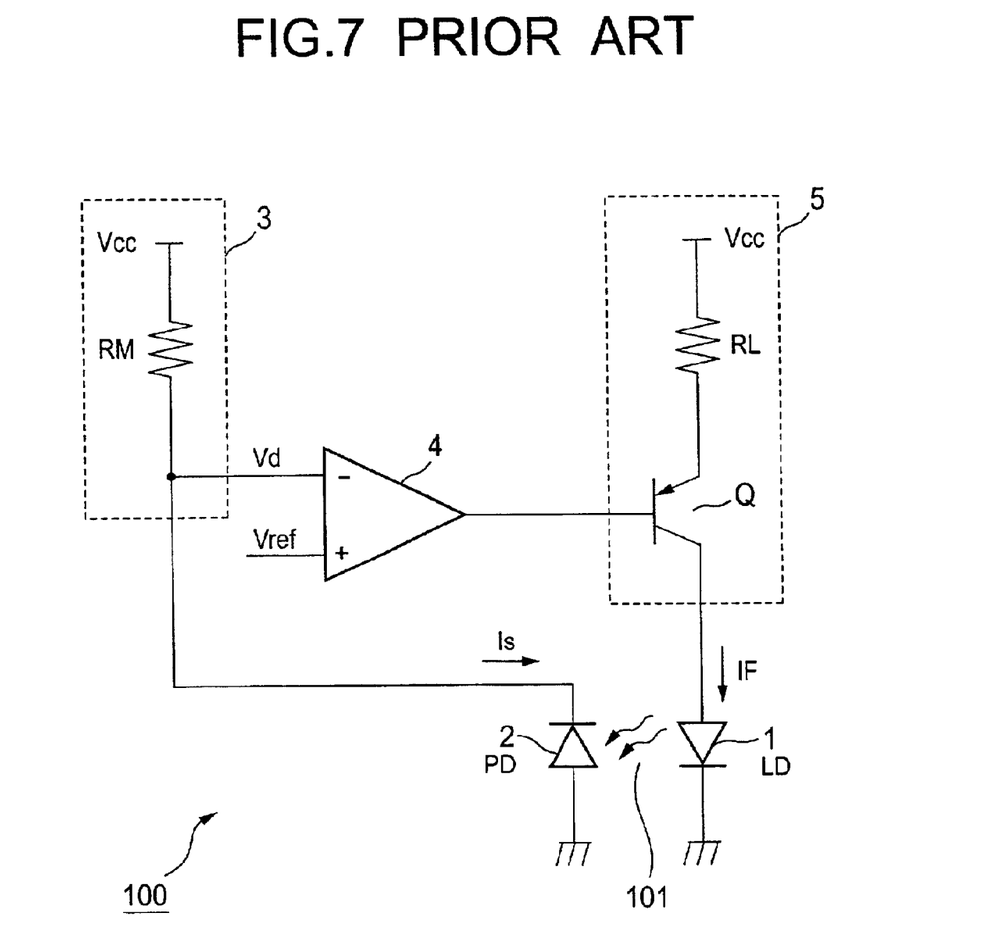
FIG. 7 is a circuit diagram for illustrating a fundamental ALPC operation.
Figure 8:
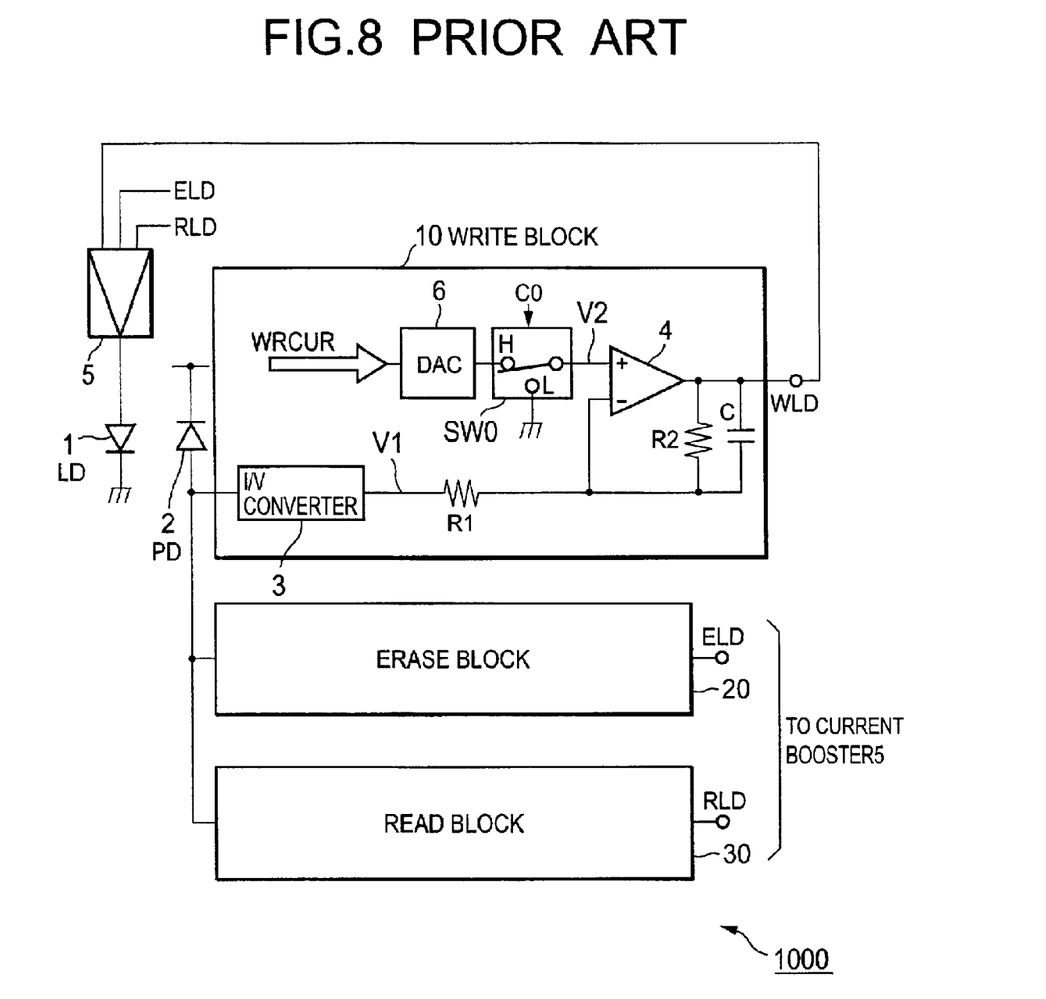
FIG. 8 is a circuit diagram illustrative of an ALPC circuit employed in an optical disk drive according to the prior art.

Based on the above ALPC circuit 1001 an optical disk device according to the prior art is equipped with an ALPC circuit 100 as shown in FIG. 8. It is to be noted that in the optical disk device, the required optical output from a laser diode differs according to the operation modes such as a write operation mode, an erase operation mode and a read operation mode. Therefore, the auto laser power control circuit 1000 is provided with a WRITE block 10, an ERASE block 20 and a READ block 30, one of which is brought into an active state in accordance with the operation mode to be currently initiated to control the driving current of the laser diode (LD) 1 during each operation mode. These blocks are substantially identical in configuration with one another. Accordingly, a description will given only to the WRITE block 107. It is noted that the same constituents as those shown in FIG. 7 are indicated by the same reference numerals to omit further description thereof.

The current flowing through PD2 in response to the optical output from the LD1 driven by the current booster 5 is supplied to the WRITE, ERASE and READ blocks 10, 20 and 30, each of which thus includes the I/V converter 3. The conversion voltage V1 is supplied through a resistor R1 to the operational amplifier 4, differently from FIG. 7. The resistor R1 determines the gain of the operational amplifier 4 together with a resistor R2 connected between the output and the non-inverting terminal of the operational amplifier 4. Such gain is set to be a considerable value, 100 for example, because a high sensitivity is required for this kind of device. However, such high gain then may sometime cause undesirable overshoot and/or undershoot in the output of the operational amplifier 4. A capacitor C is therefore connected in parallel to the resistor R2, thereby solving such a problem.

As is further distinct from FIG. 7, the reference voltage V2 to be supplied to the amplifier 4 is derived from digital data. Specifically, the reference voltage digital data WRCUR is supplied from a system controller (not shown) in the write operation mode and is converted into a reference voltage V2 by a D/A converter 6, which the voltage is then supplied to the amplifier 4 as a reference voltage Vref shown in FIG. 7 through a switch SW0 provided between the D/A converter 6 and the operational amplifier 4. The switch SW0 is controlled by a write operation mode signal C0 that assumes an active level in the write operation mode and an inactive level in the other modes. The active level of the signal C0 causes the switch SW0 to select the voltage converted by the D/A converter 6 and supplies it to the operational amplifier 4 as the reference voltage V2. When the signal C0 indicates a mode other than the write operation mode, on the other hand, the switch SW0 selects and supplies the ground potential to the operation amplifier 4, so that the LD1 is maintained uncontrolled from the WRITE block 10 even if the malfunction of the current booster 5 occurs. As is readily understood from the foregoing, each of the other blocks 20 and 30 is activated by the corresponding signal to the control signal C0 in the same manner with the unique digital data for reference voltage to corresponding mode. Each of the outputs WLD, ELD and RLD of the blocks 10, 20 and 30 is then supplied to the current booster 5. Although not shown, the current booster 5 is constructed to one of the signals WLD, ELD and RLD in response to the operation mode to be currently executed.

Thus, the LD 101 is controlled to output a laser with a substantially constant power in the respective operation modes.

It has been, however, recognized by the inventor that the ALPC circuit 100 has the problem that the shift in operation from one mode to another mode to be a relatively long period of time to deteriorate a high speed operation. This problem becomes remarkable upon the operation being moved from the erase or read mode to the write mode. This will be described below in details with reference to FIG. 9 which shows the signal voltage waveforms of respective parts in the WRITE block 10 in case where the operation mode is shifted from write to read, and then back to write.

Figure 9:
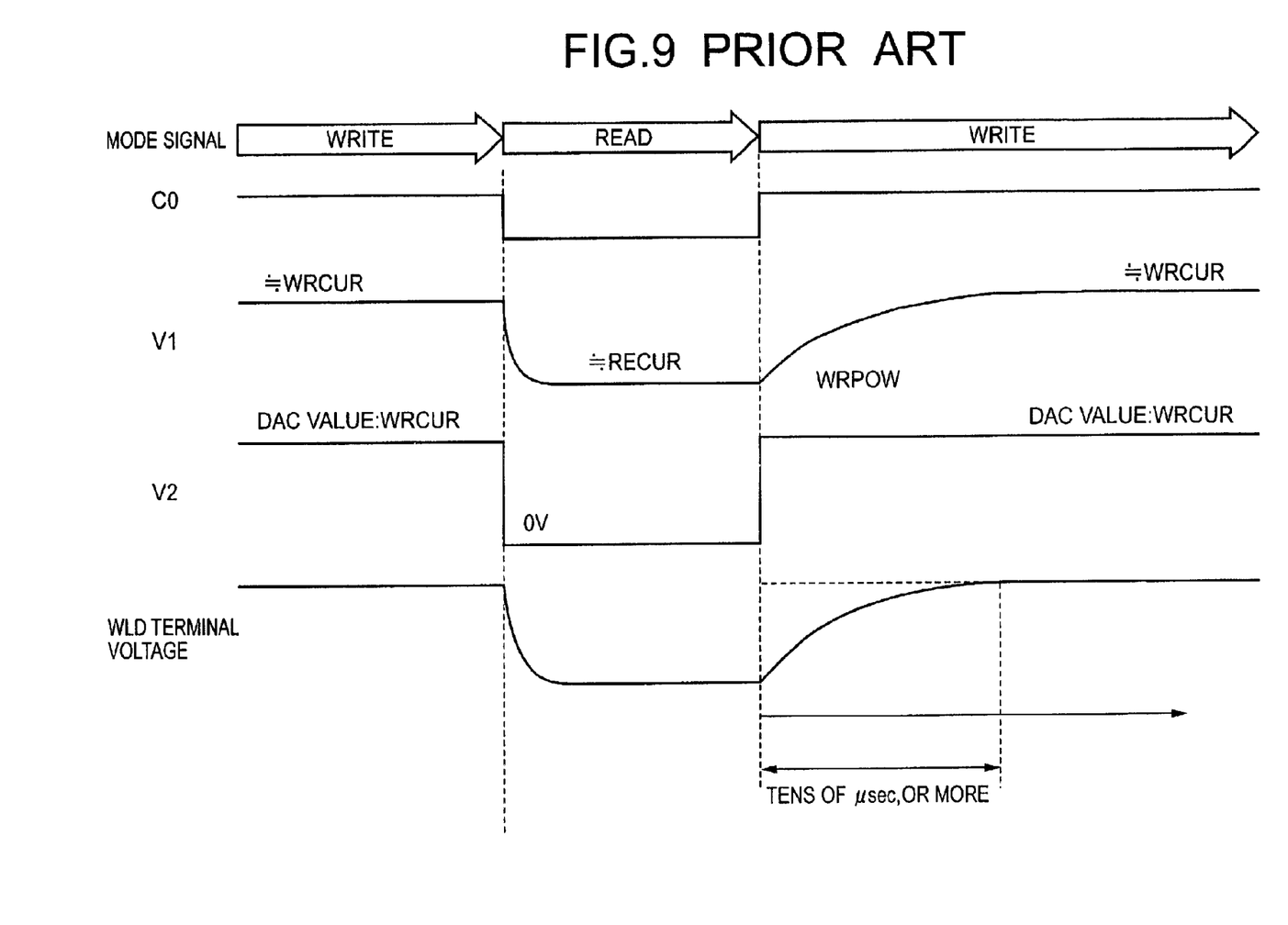
FIG. 9 is a waveform diagram respective signals produced in the ALPC circuit shown in FIG. 8.

In the write operation mode shown on the left-hand side of FIG. 9, the signal C0 assumes a high level as an active level, so that the reference voltage V2 based on the data WRCUR is supplied to the operational amplifier 4. Thus, the output terminal WLD voltage of the block 10 is controlled such that the conversion voltage V1 becomes equal to this voltage. As a result, the optical output from the LD1 is kept constant.

By the selection of the read operation mode, the signal C0 is changed to a low level as an inactive level. As a result, the ground potential is supplied to the operational amplifier 4 through the switch SW0, so that the output from the operational amplifier 4, i.e., the voltage of the WLD terminal is also changed to the ground potential.

On the other hand, the current booster 5 selects the output voltage of the READ block 30. As a result, the LD1 is held under the control of the READ block 30. Thus, the current from the PD2 becomes the optical detection current in the read operation mode. Accordingly, the signal voltage V1 in the WRITE block 10 becomes the voltage value corresponding to the data RECUR in the READ block 30. Herein, in the optical disk device, the driving current of the LD1 required in the write operation mode is considerably larger than that in the other mode. Therefore, the voltage based on the RECUR is considerably smaller as compared with the voltage based on the WRCUR.

When the read operation has been completed, and the write operation mode is selected again, the signal C0 is changed to the high level. As a result, the switch SW0 selects the D/A converter 6, so that the voltage V2 rises to the voltage value corresponding to the WRCUR. However, the voltage of the WLD terminal does not follow the voltage V2, but rises with a certain time constant as shown in FIG. 9.

Specifically, as described above, the capacitor C is provided in order to suppress the overshoot and the undershoot of the signal WRCUR which would be otherwise caused by the high gain, about 100, of the operational amplifier 4. For such a purpose, the capacitance value of the capacitor C is required to be set large (0.01 to 0.1 $\mu$F). When the write operation mode is selected, the operational amplifier 4 is first required to recharge the capacitor C which has been discharged in the previous read operation mode. However, the capacitor C has the above large capacitance value, and hence the charging of the capacitor C takes as much as several tens of $\mu$sec. The conversion voltage V1 also changes gradually. During this period, the optical output level from the laser diode LD1 is of course not stabilized. If information is written on a disk in such unstable state, the writing accuracy is deteriorated. At the worst, erroneous information may be written. For this reason, the actual write operation has to be initiated after elapse of such unstable period. Thus, the shift in operation mode cannot attained at a high speed.

As described above, a quick shift from the operation mode (ex., read operation mode) requiring a small driving current for the laser diode LD1 to the operation mode (write operation mode) requiring a large driving current is not executed. Further, there is also a high risk of erroneous writing.

SUMMARY OF THE INVENTION

An object of the present invention is to provide an improved ALPC circuit.

Another object of the present invention is to provide an ALPC circuit capable of quickly executing a transition from one operation mode to another operation mode.

A still other object of the present invention is to provide an ALPC circuit whereby the response time of a laser diode to the change in operation mode is improved.

A still further object of the present invention is to provide an ALPC circuit capable of improving the writing accuracy by a laser diode by providing a higher-speed output response upon the switching of the operation mode, while stabilizing the loop operation in the stationary state.

An ALPC circuit in accordance with the present invention is constructed such that a voltage responsive to the optical output of a laser diode generated in accordance with a driving current flowing therethrough is compared with a reference voltage to produce a voltage difference, and the driving current is controlled so as to decrease the voltage difference with a first time constant (or first driving ability) during a steady operation and with a second time constant (or second driving ability) that is smaller than the first time constant (the first driving ability) upon initiation.

More specifically, controlling the driving current during the steady operation is executed with such a first time constant (ability) that suppresses an undesirable overshoot and/or undershoot. On the other hand, upon initiation in which a transition from a first mode such as a read operation to a second operation mode such as a write operation occurs, the control to the driving current is not executed with the first time constant (ability), but is executed is with a second, smaller time constant smaller (that is, a second, larger driving ability) than the first one. In this manner, the operation mode is quickly shifted, and the stabilization in the optical output of the laser diode is also improved.

The period of time during which the driving current is being controlled with the second time constant (second driving ability) may be determined by observing a signal based on the optical output of the laser diode. However, it is preferable to set such period of time at a certain balue without observing the signal derived from the laser diode. This control may be attained in a timer operation manner. This is because that the second time constant (second driving ability) may be easily obtained by deactivating the feedback loop that functions during the steady operation and such deactivation can be attained by the state of a switch that is controlled by a timer.

In more detail, the control of the driving current during the steady operation is performed by a operational amplifier that compares the voltage indicative of the optical output of the laser diode with the reference voltage, and the parallel connection of a resistor and a capacitor is provided between the input and output terminals of the operational amplifier to control its gain and to suppress the undesirable overshoot and/or undershoot. In such configuration, therefore, a switch is provided in parallel to the parallel connection in accordance of the present invention. This switch is brought into an OFF state during the steady operation and into an ON state upon initiation. The state of the switch is changed to the OFF state after a predetermined period of time that is controlled by a timer. It is thus possible to obtain the first and second time constants (first and second driving ability).

An auto laser power control circuit according to another aspect of the present invention includes an operational amplifier producing an output signal in response to a voltage difference between a voltage representative of a laser power of a laser diode and a reference voltage and a driving circuit driving the laser diode in response to the output so as to make the voltage difference small, with the amplifier changing its output signal at a first rate during a predetermined period of time from a time point at which the auto laser power control circuit is initiated and thereafter changing the output signal at a second rate that is lower than the first rate.

BRIEF DESCRIPTION OF DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
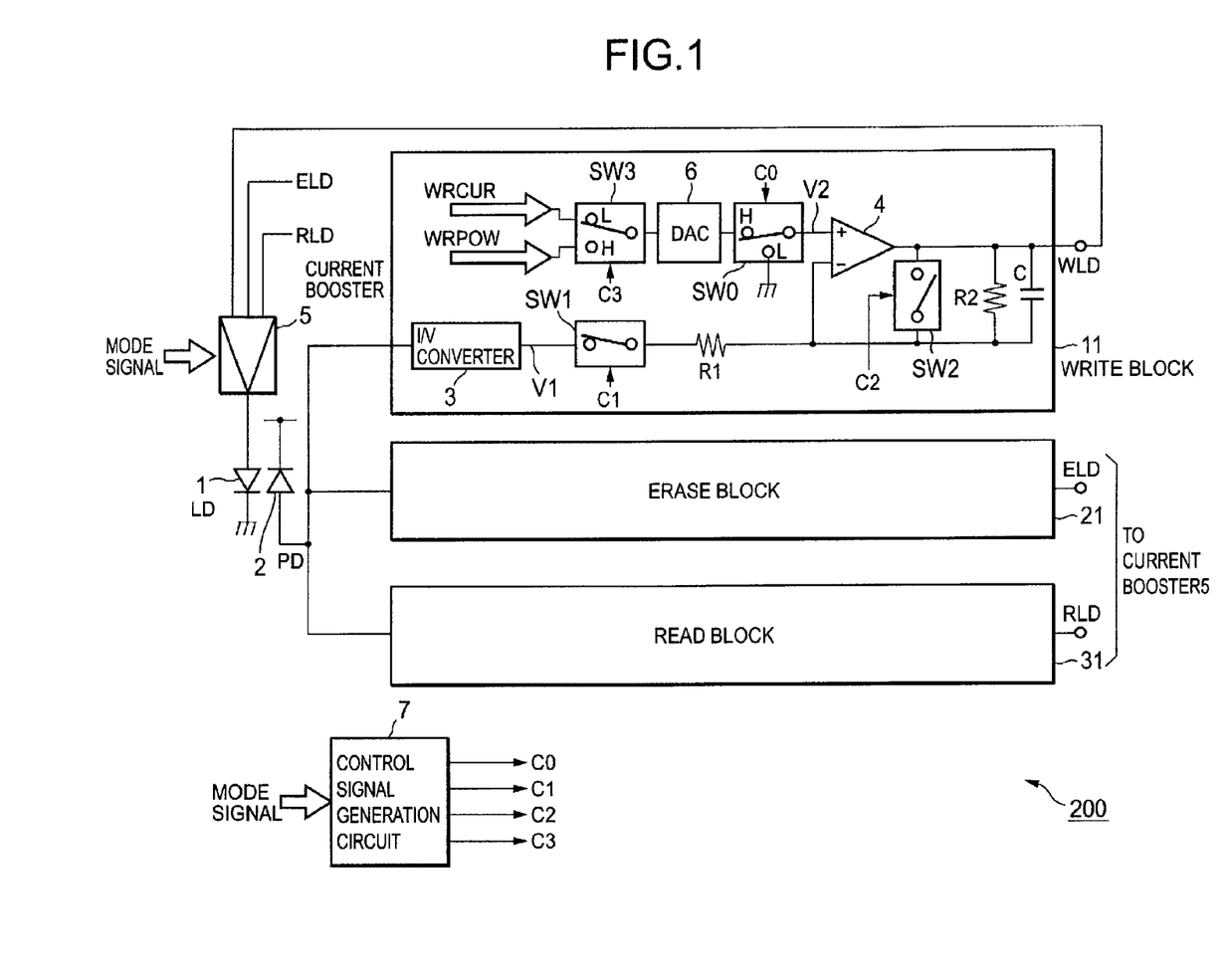
FIG. 1 is a circuit diagram illustrative of an ALPC circuit according to a first embodiment of the present invention.

Referring now to FIG. 1, an ALPC circuit 200 according to the first embodiment of the present invention includes a WRITE block 11, and ERASE block 21 and a READ block 31. These blocks are substantially identical in configuration with one another. Accordingly, a detailed explanation will be made only on the WRITE block 11. It is to be noted that the same constituents as those shown FIG. 8 are denoted by the same reference numerals and the further description thereon is omitted.

In this embodiment, a switch SW2 is provided in accordance with present invention, which is connected in parallel to a resistor R2 and a capacitor C between the output terminal and the inverting input terminal of an operational amplifier 4. The switch SW2 is controlled by a control signal C2 supplied from circuit 7, that responds to Mode signal. The signal C2 assumes an active level during the predetermined period of time in response to the designation or selection of the write operation mode for initiating the WRITE block 11. The signal C2 is changed to an inactive level after such period of time and maintained at the inactive level during the steady operation in the write operation mode. The signal C2 also takes the inactive level in a mode such as read and erase other than the write operation mode. When the signal C2 is at the low level as the inactive level, the switch SW2 is turned OFF state. The gain of operational amplifier 4 is thus determined by the resistors R1 and R2, and further the capacitor C operates to suppress the overshoot and/or undershoot of the signal at the terminal WLD. Thus, the amplifier 4 drives the terminal WLD with a first time constant or a first driving ability. When the signal C2 takes the high level as the active level, the switch SW2 is turned ON state. The operational amplifier 4 thus functions as a voltage follower to have the level at the terminal WLD follow the input voltage V2 in spite of the resistors R1 and R2 and the capacitor C. Thus, the amplifier 4 drives the terminal WLD with a second time constant or a second driving ability that is smaller than the first time constant or is larger than the first driving ability. The change in signal at the terminal WLD is thus made at a higher rate.

In order to made it sure that the terminal WLD is driven by the operational amplifier 4 as a voltage follower during the signal C2 taking the active level, a switch SW1 is further provided and connected between the I/V converter 3 and the resistor R1. This switch SW1 is controlled by a control signal C1 such that it is turned ON only during the steady operation in the write operation mode. During the remaining modes including the initiation of the write operation mode, the switch SW1 is brought into the OFF state. The I/V converter 3 is thus disconnected from the resistor R1.

It is convenient to generate, upon initiation of the write operation mode, at the terminal WLD such a voltage that is higher than the voltage to be produced during the steady operation in the write operation mode, for the purpose of raising the level of terminal WLD at a much higher rate. To this end, additional digital data WRPOW for such voltage is supplied from a system controller (not shown). As is discussed with reference to FIG. 8, the data WRCUR provides a reference voltage to be produced during the steady operation. These two digital data are supplied to the switch SW3 which is controlled by a control signal C3. The signal C3 assumes one logic level at lease upon the initiation of the write mode or at least during the predetermined period from the time point at which the write operation mode is started, and assumes the other logic level during the steady operation in the write operation mode. When the signal C3 takes the high level as one logic level, the switch SW3 selects and supplies the data WRPOW to the D/A converter 6. During the whole period of time in the write operation mode, the switch SW0 forms an electrical path between the D/A converter 6 and the amplifier 4. Accordingly, the voltage based on the data WRPOW is supplied as the reference voltage V2 to the operational amplifier 4. When the signal C3 is changed to the other logic level, i.e., the low level, the reference voltage is derived from the data WRCUR and supplied to the operational amplifier 4.

Although not shown, the control signal generation circuit 7 generating the control signals C0 to C3 includes a timer counter. This counter starts it operation to count a clock signal in response to the MODE signal being changed to designate the write mode from another mode and produces an output after the counting values of the clock signal reaches a predetermined value. This period of time is defined as the initiation of the write operation mode. By utilizing the timer counter and the MODE signal, the circuit 7 generates the control signals C0 to C3 whose logic levels are controlled as described above. It is apparent that the further detailed description on the circuit 7 is not necessary, because the one having ordinary skill in the art will readily understand the construction and operation of the circuit 7 with reference also to timing chart shown in FIG. 9.

Figure 2:
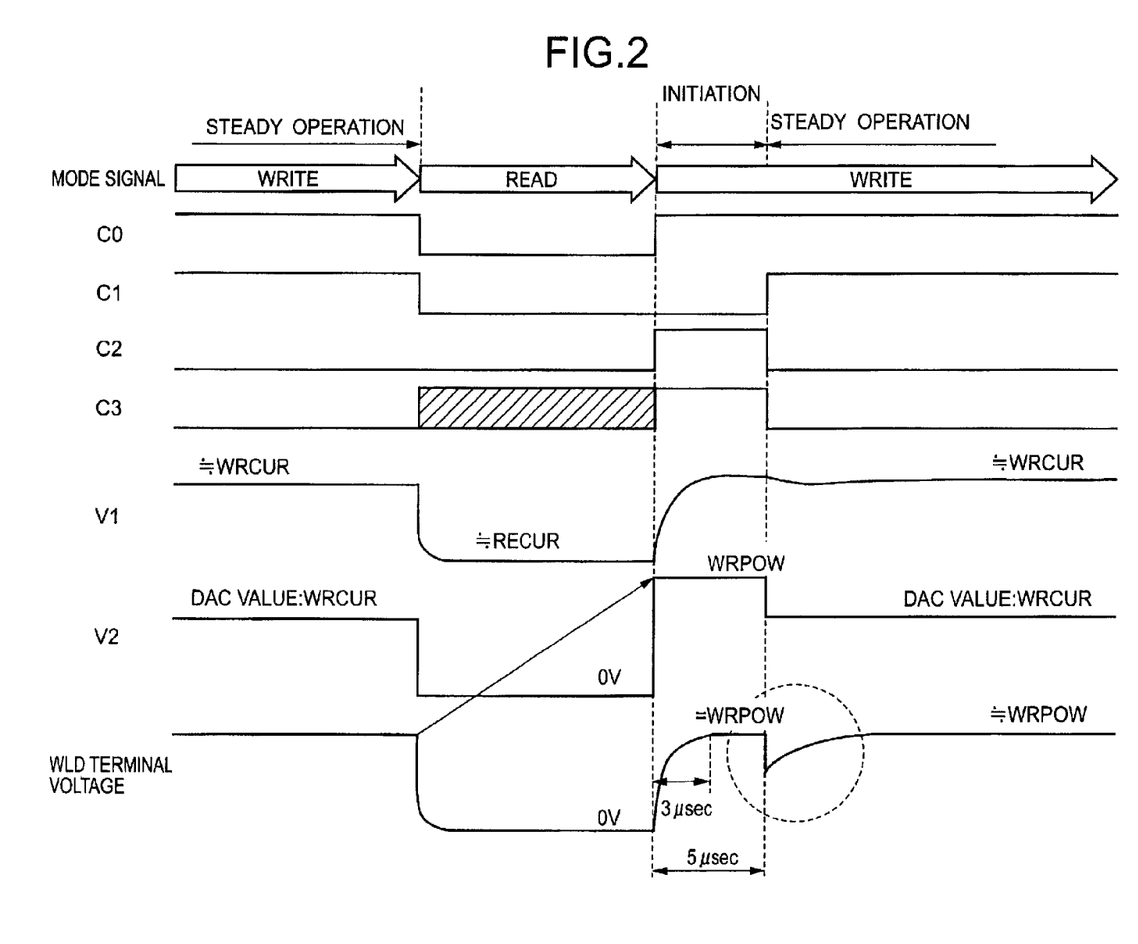
FIG. 2 is a waveform diagram of the respective signals produced in the circuit shown in FIG. 1.

The description will be now moved on the operation of the ALPC circuit 200 with reference to FIG. 2 in which operation mode makes a transition from writing to reading and again back to writing. Note that the write operation mode shown on the left-hand side of FIG. 2 shows the steady operation in the write operation mode. The signal C1 thus assumes the high level as the active level, so that the switch SW1 is brought into the ON state. Accordingly, the conversion voltage V1 is supplied to the operational amplifier 4. Further, the signal C2 assumes the low level as the inactive level, so that the switch SW2 is in the OFF state. Further, the signal C3 assumes the low level as the inactive level, so that the switch SW3 selects the data WRCUR. Accordingly, the reference voltage V2 based on the data is supplied to the operational amplifier 4. Therefore, the voltage of the output terminal WLD of the block 11 is controlled such that the conversion voltage V1 becomes equal to the reference voltage V2 based on the data WRCUR. As a result, the optical output from the LD1 becomes substantially constant.

By the selection of the read operation mode, the signals C1 and C2 both assume the low level as the inactive level. During this mode, the signal C3 is allowed to take any one of the low and high levels. The signal C0 is changed to the low level, so that the ground potential is supplied to the operational amplifier 4 through the switch SW0. Accordingly, the output from the operational amplifier 4, i.e., the voltage of the terminal WLD is also changed to the ground potential.

On the other hand, the current booster 5 selects the output voltage of the READ block 31. As a result, the LD1 is held under the control of the READ block 31.

When the read operation has been completed, and the write operation mode is selected again. The signals C0 and C3 are changed to the high level upon the start thereof. As a result, the D/A converter 6 is selected by the switch SW0, and the set voltage data WRPOW is selected by the switch SW3, so that the reference voltage V2 rises to the voltage value corresponding to the set voltage data WRPOW. On the other hand, the signal C1 is kept at the low level, and the signal C2 is changed to the high level. Accordingly, the operational amplifier 4 starts to operate as a voltage follower without influence of the conversion voltage V1. Therefore, the terminal WLD is driven by the operational amplifier 4 to follow the voltage based on the data WRPOW. In other words, the capacitor C is separated from the operation for increase the level at the terminal WLD. Therefore, the rising time constant of the terminal WLD voltage can be set at a very smaller value. The WLD terminal thus reaches the WRPOW voltage level in about 3 μsec.

In this embodiment, the period of time defined as "initiation" is set to be 5 μsec. After 5 μsec., therefore, the signal C1 is changed to the high level, so that the conversion voltage V1 is supplied to the operational amplifier 4 through the switch SW1. At the same timing, the signals C2 and C3 are both changed to the low level. Accordingly, the switch SW2 is brought into the OFF state, and the set voltage data WRCUR is selected by the switch SW3. As a result, the reference voltage V2 based on the data WRCUR is supplied to the operational amplifier 4. The output voltage of the terminal WLD is controlled so that the conversion voltage V1 becomes equal to this voltage. Consequently, the optical output from the LD1 becomes constant. The overshoot and the undershoot of the terminal WLD voltage are suppressed by the capacitor C.

It is preferable that the period of time corresponding to "initiation" is set to be longer the time period required for the WLD terminal voltage to rise up to the voltage V2 based on the set voltage data WRPOW. In this manner, the voltage of the WLD terminal quickly becomes the voltage equal to the terminal WLD voltage at the steady operation when the operation mode is changed from the read operation to the write operation mode. As a result, the LD1 quickly obtains an optical output necessary for the write operation mode.

At the beginning of the steady operation in the write operation mode, the switch SW1 is brought into the ON state, so that the conversion voltage V1 is supplied to one of electrodes of the capacitor C. In consequence, the operation WLD terminal voltage decreases as indicated by the portion surrounded by the dotted lines of FIG. 2. Such decrease in the terminal WLD voltage does not provide a substantial affect to the optical output from the LD1. This is because the terminal WLD voltage corresponding to such a level that is obtained by multiplying the input voltage by the amplification gain (ex., 100) set by the resistors R1 and R2 of the operational amplifier 4 and thus the change of the conversion voltage V1 is compressed to such a value that is obtained by dividing the change of WLD voltage by the gain. The conversion voltage V1 decreases slightly lower than the reference voltage V2 as shown in FIG. 2.

Figure 3:
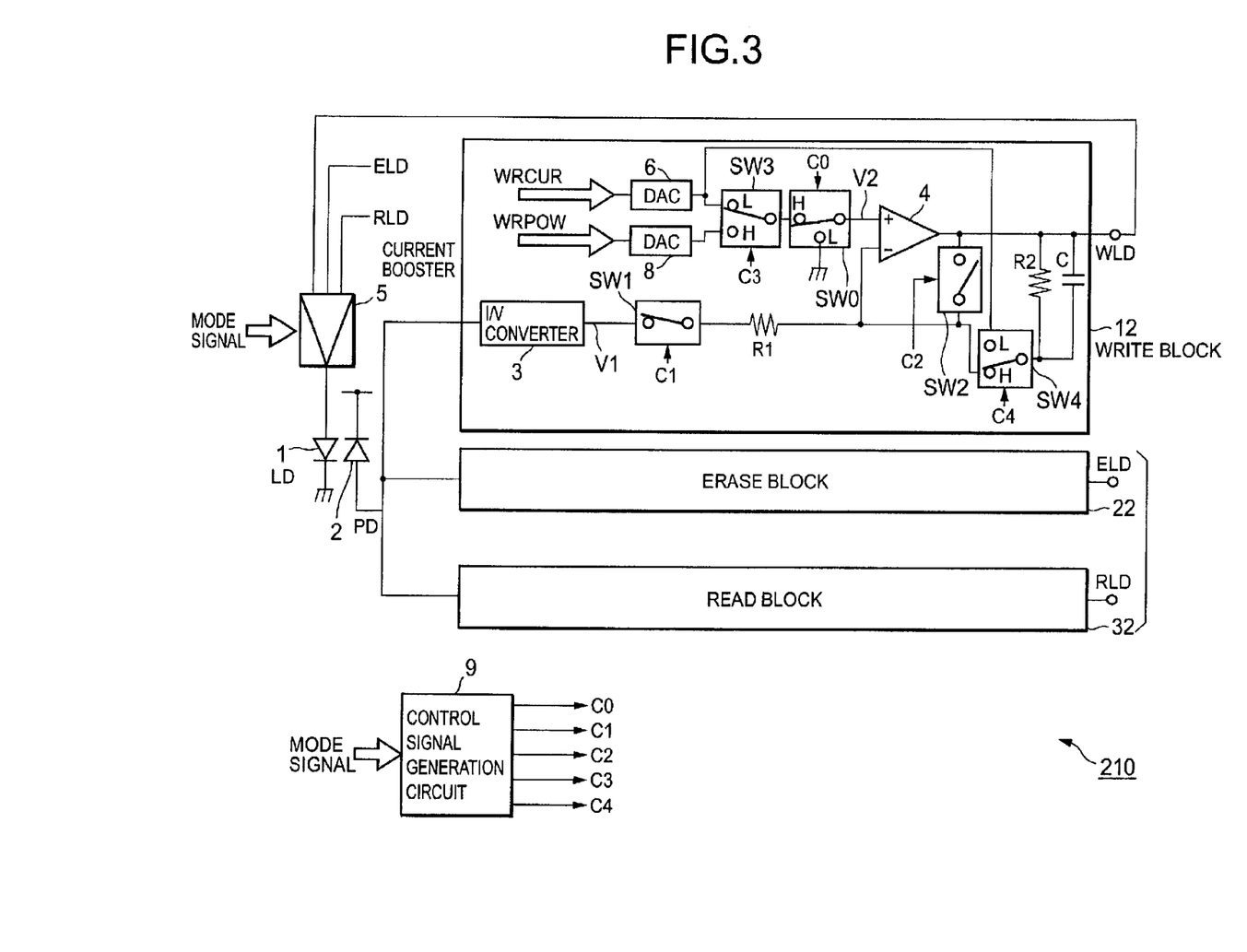
FIG. 3 is a circuit diagram illustrative of an ALPC circuit according to a second embodiment of the present invention.

Referring now to FIG. 3, an ALPC circuit 210 according to the second embodiment of the present invention includes a WRITE block 12, a ERASE block 22 and a READ block

32. These blocks are substantially identical in configuration with one another. It is to be noted that the same constituents as those shown in FIG. 1 are indicated by the same reference numerals to omit further description thereof.

The reference voltage digital data WRCUR and WRPOW are converted by the D/A converter 6 and 8, respectively, differently from FIG. 1. These two reference voltages are supplied to the switch SW3 that is controlled by a control signal C3.

As is further distinct from FIG. 1, a switch SW4 is coupled between one of electrodes of a capacitor C and the inverting input terminal of a operational amplifier 4. The switch SW4 is controlled by a control signal C4 supplied from a circuit 9 that responds to MODE signal. The signal C4 assumes one logic level during the steady operation in the write operation mode, and assumes the other logic level at least upon the initiation of the write operation mode or at least during the predetermined period from the time point at which the write operation mode is started. When the signal C4 takes the high level as one logic level, the switch SW4 forms an electrical path between the inverting input terminal of the operational amplifier 4 and one of electrodes of the capacitor C. When the signal C4 is changed to the other logic level, i.e., the low level, the switch SW4 selects and supplies the voltage based on the data WRCUR to one of electrodes of the capacitor C. Thus, the capacitor C is charged with the voltage difference between the voltage of the terminal WLD and the voltage based on the data WRCUR during the initiation of the write operation mode.

Although not shown, the control signal generation circuit 9 generating the control signals C0 to C4 includes a timer counter. The circuit 9 generates the control signal C0 to C3 with the counter, as the circuit 7 does, and generates further the control signal C4 whose logic levels is controlled as described above.

Figure 4:
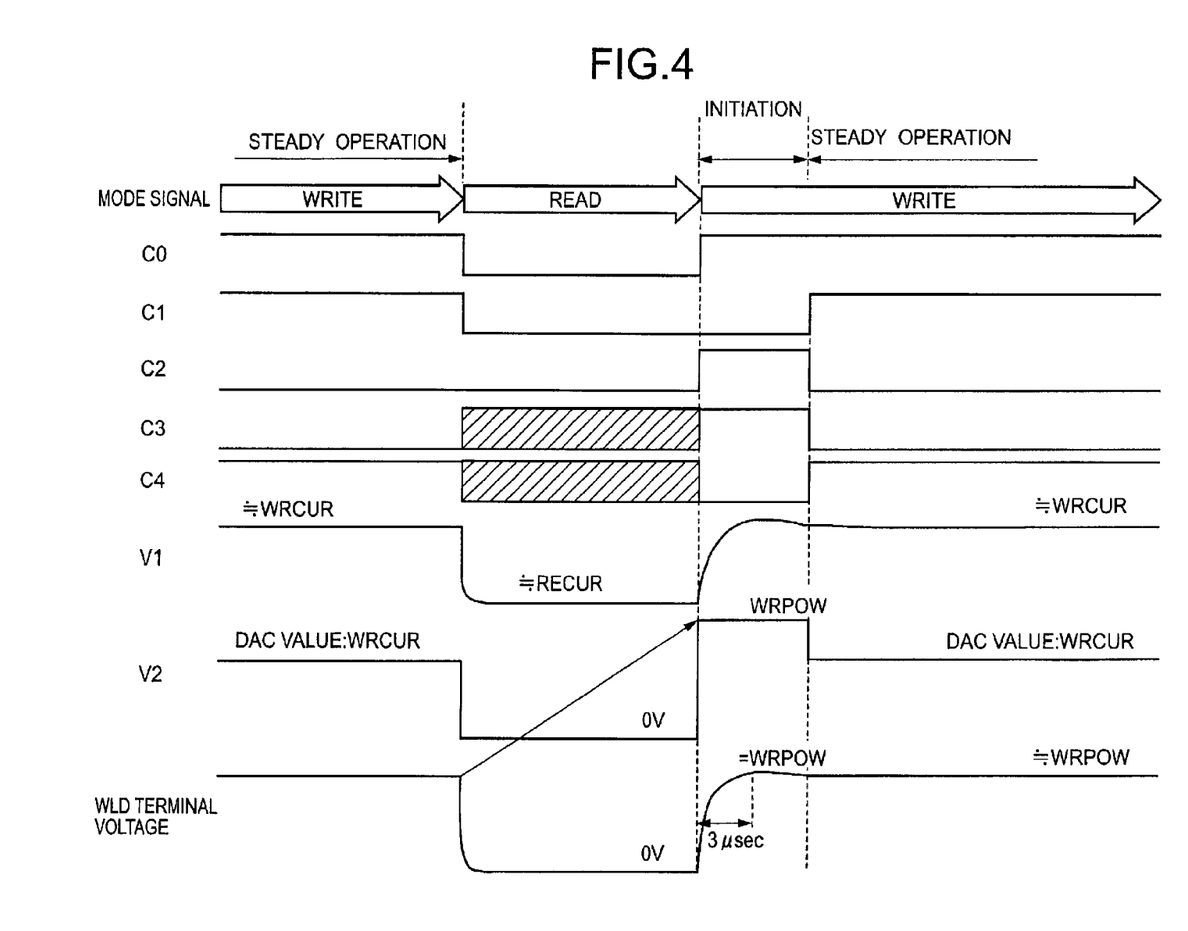
FIG. 4 is a waveform diagram of the respective signals produced in the circuit shown in FIG. 3.

The description will be now moved on the operation of the ALPC circuit 210 with reference FIG. 4 in which operation mode makes the same transition as shown in FIG. 2.

During the steady operation in the write operation mode shown on the left-handed side of FIG. 4, the conversion voltage V1 and the reference voltage V2 based on the data WRCUR are supplied to the operational amplifier 4 by the switches SW1, SW2 and SW3, as described above. The signal C4 thus assumes the high level as the one level, so that the electrical path between the inverting input terminal of the operational amplifier 4 and one of the capacitor C is formed. Therefore, the voltage output terminal WLD of the block 12 is controlled such that the conversion voltage V1 becomes equal to the reference voltage V2 based on the data WRCUR.

When the read operation mode is selected, the signal C4 as well as the signal C3 is allowed to take any one of the low and high levels. The switch SW0 selects and supplies the ground potential to the operational amplifier 4 in response to the signal C0. Accordingly, the voltage of the terminal WLD is also changed to the ground potential. On the other hand, the current booster 5 selects the output voltage of the READ block 32, so that the LD1 is held under the control of the READ block 32.

When the read operation has been completed, and the write operation mode is selected again. The signal C4 is changed to the low level upon the start thereof. As a result, the switch SW4 selects the D/A converter 6, so that the voltage based on the data WRCUR is supplied to one of electrodes of the capacitor C. On the other hand, the operational amplifier 4 starts to operate as a voltage follower, so that terminal WLD is driven by the operational amplifier 4 to follow the voltage based on the data WRPOW. Therefore, the rising time constant of the terminal WLD voltage can be set at a very small value as the first embodiment. In addition, the capacitor is charged with a voltage difference between the voltages based on the data WRCUR and WRPOW.

At the beginning of the steady operation in the write operation mode, the switch SW1 is brought into the ON state, and the switch SW4 forms the electrical path between one of electrodes of the capacitor C and the inverting input terminal of the operational amplifier 4. As a result, the conversion voltage V1 is supplied to one of electrodes of the capacitor C. However, in this embodiment the operation WLD terminal voltage does not decrease as shown in FIG. 2. This is because the capacitor C is charged before the steady operation in the write operation mode. Therefore, the LD1 quickly obtains an optical output necessary for the write operation mode without such decrease in the terminal WLD as shown in FIG. 2.

Figure 5:
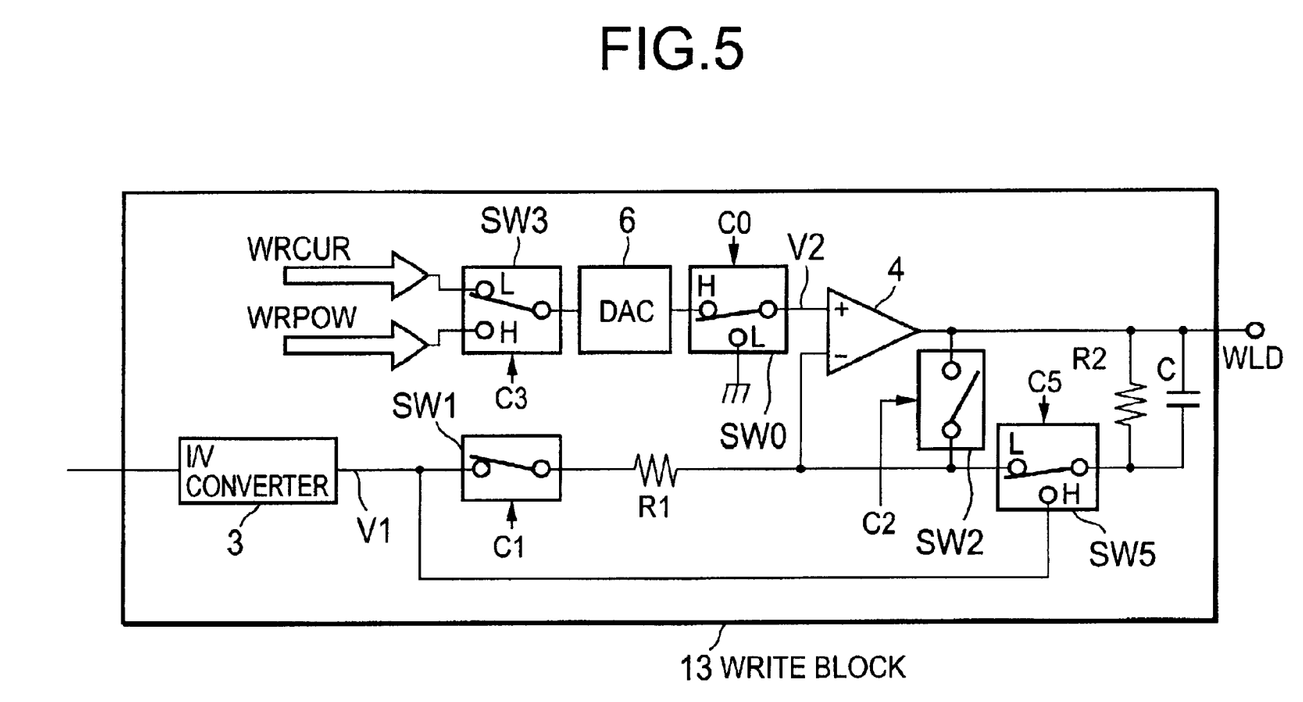
FIG. 5 is a circuit diagram illustrative of a WRITE block in an ALPC circuit for illustrating a third embodiment of the present invention.

Further, in a third embodiment of the present invention as shown in FIG. 5, a switch SW5 is coupled between one of electrodes of a capacitor C and the inverting input terminal of a operational amplifier 5 in place of the switch SW4 as shown in FIG. 3.

In this embodiment, a switch SW1 is turned OFF state and the switch SW5 selects the conversion voltage V1 when the write operation mode is selected. Thus, the conversion voltage V1 is supplied not to the inverting input terminal of the operational amplifier 4 but to one of electrodes of the capacitor C. Therefore, the capacitor C is charged with the voltage difference between the conversion voltage V1 and the voltage of the terminal WLD before the steady operation in the write operation mode. Therefore, the voltage of the WLD terminal does not decreases even if the steady operation in the write operation mode is started.

As mentioned above, the switching driving current is carried out by the current booster 5 that selects the WLD, ELD and RLD terminal in response to the operation mode to be currently executed in the above embodiments. However, the way of switching is not limited to such switching. Further, the converting the output voltage of the operational amplifier into driving current is not limited to the above embodiments. Therefore, the set voltage data WRPOW is not limited to the voltage that is higher than the set voltage data WRCUR.

It is apparent that the present invention is not limited to the above embodiments, but may be modified and changed without departing from the scope and spirit of the invention.

What is claimed is:

1. A power control circuit for a laser diode, comprising:
   an amplifier circuit producing at an output terminal thereof an output voltage responsive to a voltage difference between a reference voltage and a feedback voltage that is indicative of an optical power generated by said laser diode in response to a driving current flowing therethrough; and a driving circuit responding to said output voltage to control said driving current so as to make said voltage difference small, said amplifier circuit driving said output terminal with a first time constant during a steady operation and with a second time constant that is smaller than said first time constant upon initiation and before said steady operation.

2. The circuit according to claim 1, wherein said second time constant is derived by increasing a driving ability of said amplifier circuit upon said initiation larger than that during said steady operation.

3. The circuit according to claim 1, wherein said amplifier circuit includes an operational amplifier, a capacitor coupled between output and input ends of said operational amplifier, and a first switch coupled in parallel to said capacitor, said first switch being turned OFF during said steady operation and ON upon said initiation.

4. The circuit according to claim 3, wherein said amplifier circuit further includes a first resistor, a second resistor coupled in parallel to said capacitor, and a second switch coupled to said input end of said operational amplifier through said first resistor, said second switch being turned ON during said steady operation and OFF upon said initiation.

5. The circuit according to claim 4, wherein said amplifier circuit further includes a fourth switch coupled between said input end of said operational amplifier and said capacitor, forming an electrical path between said input end of said operational amplifier and said capacitor during said steady operation and providing said capacitor with said feedback voltage without said electrical path upon said initiation.

6. The circuit according to claim 3, wherein said amplifier circuit further includes a reference voltage generation circuit coupled to said amplifier circuit, generating first and second reference voltages and providing said amplifier circuit with said first reference voltage as said reference voltage during said steady operation and with said second reference voltage that is higher than said first reference voltage as said reference voltage upon said initiation.

7. The circuit according to claim 6, wherein said amplifier circuit further includes a third switch coupled to said capacitor, forming an electrical path between said input end of said operational amplifier and said capacitor during said steady operation and providing said capacitor with said first reference voltage upon said initiation.

8. The circuit according to claim 1, wherein said output voltage comprises a steady operation period of time and an initiation period of time prior to said steady operation period of time.

9. The circuit according to claim 1, wherein said driving current flows through said laser diode during both said steady operation period of time and said initiation period of time.

10. A power control circuit for a laser diode, comprising:

a first amplifier circuit producing, when activated, at a first output terminal thereof a first output voltage responsive to a first voltage difference between a first reference voltage and a feedback voltage that is indicative of an optical power generated by said laser diode in response to a driving current flowing there through;

a second amplifier circuit producing, when activated, at a second output terminal thereof a second output voltage responsive to a second voltage difference between a second reference voltage and said feedback voltage; and a driving circuit responding to an activated one of said first and second output voltage to control said driving current so as to make a corresponding one of said first and second voltage difference small, respectively, at least one of said first and second amplifier circuits driving one of said first and second output terminals with a first time constant during a steady operation and with a second time constant that is smaller than said first time constant upon initiation and before said steady operation.

11. The circuit according claim 10, wherein said second time constant is derived by increasing a driving ability of said amplifier upon said initiation larger than that during said steady operation.

12. The circuit according claim 10, wherein at least one of said first and second amplifier circuits includes an operational amplifier, a capacitor coupled between output and input ends of said operational amplifier, and a first switch coupled in parallel to said capacitor, said first switch being turned OFF during said steady operation and ON upon said initiation.

13. The circuit according claim 12, wherein at least one of said first and second amplifier circuits further includes a first resistor, a second resistor coupled in parallel to said capacitor, and a second switch coupled to said input end of said operational amplifier through said first resistor, said second switch being turned ON during said steady operation and OFF upon said initiation.

14. The circuit according claim 13, wherein at least one of said first and second amplifier circuits further includes a reference voltage generation circuit generating first and second reference voltages and providing said operational amplifier with said first reference voltage during said steady operation and with said second reference voltage that is higher than said first reference voltage as said reference voltage upon initiation.

15. The circuit according to claim 14, wherein at least one of said first and second amplifier circuits further includes a fourth switch coupled between said input end of said operational amplifier and said capacitor, forming an electrical path between said input end of said operational amplifier and said capacitor during said steady operation and providing said capacitor with said feedback voltage without said electrical path upon said initiation.

16. The circuit according to claim 13, wherein at least one of said first and second amplifier circuits further includes a third switch coupled to said capacitor, forming an electrical path between said input end of said operational amplifier and said capacitor during said steady operation and providing said capacitor with said first reference voltage upon said initiation.

17. The circuit according to claim 10, wherein each of said first and second output voltages comprises a steady operation period of time and an initiation period of time prior to said steady operation period of time.

18. The circuit according to claim 17, wherein said driving current flows through said laser diode during both said steady operation period of time and said initiation period of time.

19. The circuit according to claim 17, wherein at least one of said first and second amplifier circuits drives an associated one of said first and second output terminals with a first time constant during said steady operation period of time and with a second time constant, which is smaller than said first time constant, during said initiation period of time.

20. A power control circuit for a laser diode, comprising:

an amplifier circuit producing at an output terminal thereof an output voltage responsive to a voltage difference between a reference voltage and a feedback voltage that is indicative of an optical power generated by said laser diode in response to a driving current flowing therethrough; and a driving circuit responding to said output voltage to control said driving current so as to make said voltage difference small, wherein said output voltage comprises a steady operation period of time and an initiation period of time prior to said steady operation period of time, wherein said driving current flows through said laser diode during both said steady operation period of time and said initiation period of time, and wherein said amplifier circuit drives said output terminal with a first time constant during said steady operation period of time and with a second time constant, which is smaller than said first time constant, during said initiation period of time.

21. A power control circuit for a laser diode, comprising:

an amplifier circuit producing at an output terminal thereof an output voltage responsive to a voltage difference between a reference voltage and a feedback voltage that is indicative of an optical power generated by said laser diode in response to a driving current flowing therethrough, said amplifier circuit including an operational amplifier;

a driving circuit responding to said output voltage to control said driving current so as to make said voltage difference small;

a capacitor coupled between input and output ends of said operational amplifier;

a first switch coupled in parallel to said capacitor;

a first resistor coupled to an input end of said operational amplifier; and a second switch coupled to said input end of said operational amplifier through said first resistor.

* * * * *